(12) United States Patent
Chou

(10) Patent No.: US 6,969,200 B2
(45) Date of Patent: Nov. 29, 2005

(54) BEARING SUPPORTING STRUCTURE

(75) Inventor: Chu-Hsien Chou, Taipei Hsien (JP)

(73) Assignee: Asia Vital Components Co., LTD, Kaohsiung (TW)

( * ) Notice: Subject to any disclaimer, the term of this patent is extended or adjusted under 35 U.S.C. 154(b) by 196 days.

(21) Appl. No.: 10/646,756

(22) Filed: Aug. 25, 2003

(65) Prior Publication Data
US 2005/0047695 A1    Mar. 3, 2005

(51) Int. Cl.[7] .......................... F16C 43/02; F16C 43/04
(52) U.S. Cl. ...................... 384/428; 384/119; 384/539
(58) Field of Search ........................ 384/100, 114, 119, 384/295, 428, 442, 537, 539; 310/90; 417/354, 417/423.12, 423.13

(56) References Cited

U.S. PATENT DOCUMENTS

| | | | | |
|---|---|---|---|---|
| 3,481,655 A | * | 12/1969 | Campbell | .................... 384/536 |
| 4,682,065 A | * | 7/1987 | English et al. | ................. 310/90 |
| 4,750,878 A | * | 6/1988 | Nix et al. | .................... 384/296 |
| 5,562,347 A | * | 10/1996 | Hsieh | ........................... 384/428 |
| 5,650,678 A | * | 7/1997 | Yokozawa et al. | ............. 310/90 |
| 6,376,952 B1 | * | 4/2002 | Stenta | .......................... 384/295 |
| 6,654,213 B2 | * | 11/2003 | Horng et al. | .................. 361/23 |

* cited by examiner

Primary Examiner—Thomas R. Hannon
(74) Attorney, Agent, or Firm—Bacon & Thomas PLLC

(57) ABSTRACT

A bearing supporting structure includes a bearing sleeve provided on a motor stator unit for supporting a bearing therein and a coil therearound. The bearing sleeve is provided on an inner wall surface near an outer end thereof with radially inward projected stoppers, and split at an inner end to provide a plurality of spaced segments having a certain elasticity, each of which is provided at a lower inner surface with a radially inward projected flange having an inclined side surface. The bearing is moved through the flanges into the bearing sleeve to stably position therein between the stoppers and the flanges, so that the bearing may be quickly and easily removed from the bearing sleeve via the elastic segments without the need of moving the coil externally mounted around the bearing sleeve.

4 Claims, 9 Drawing Sheets

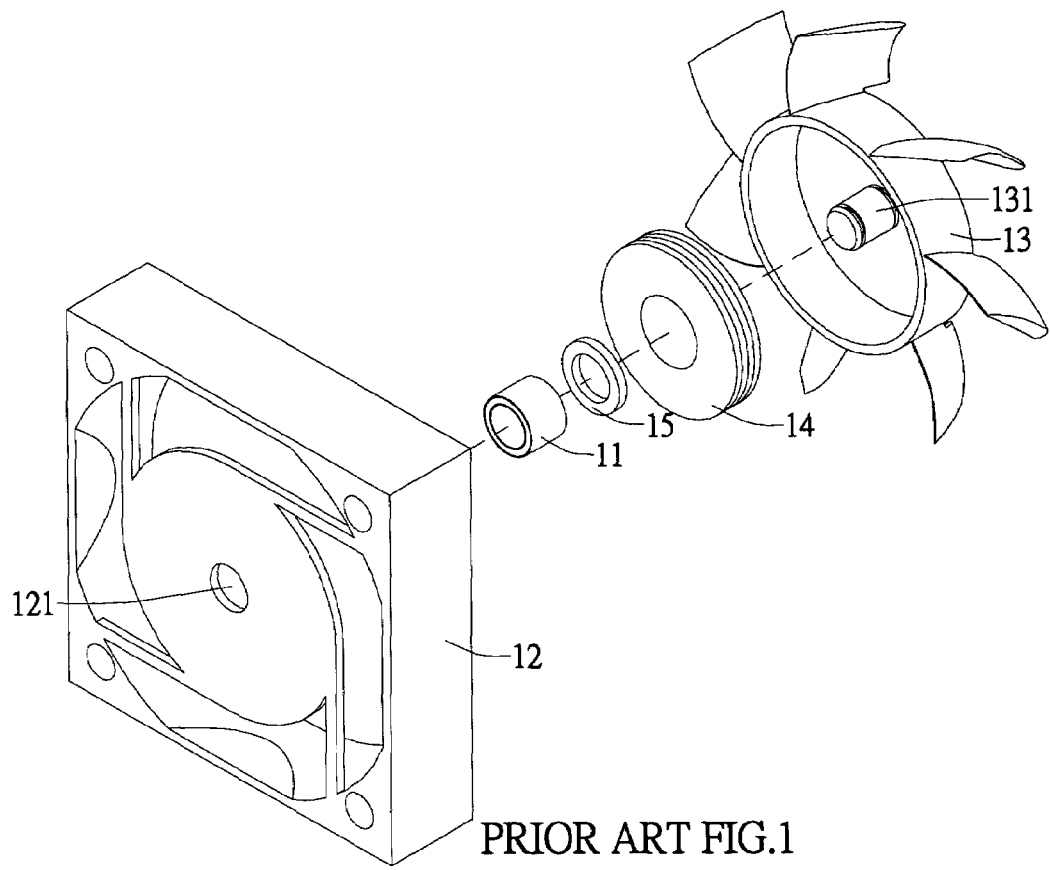
PRIOR ART FIG.1
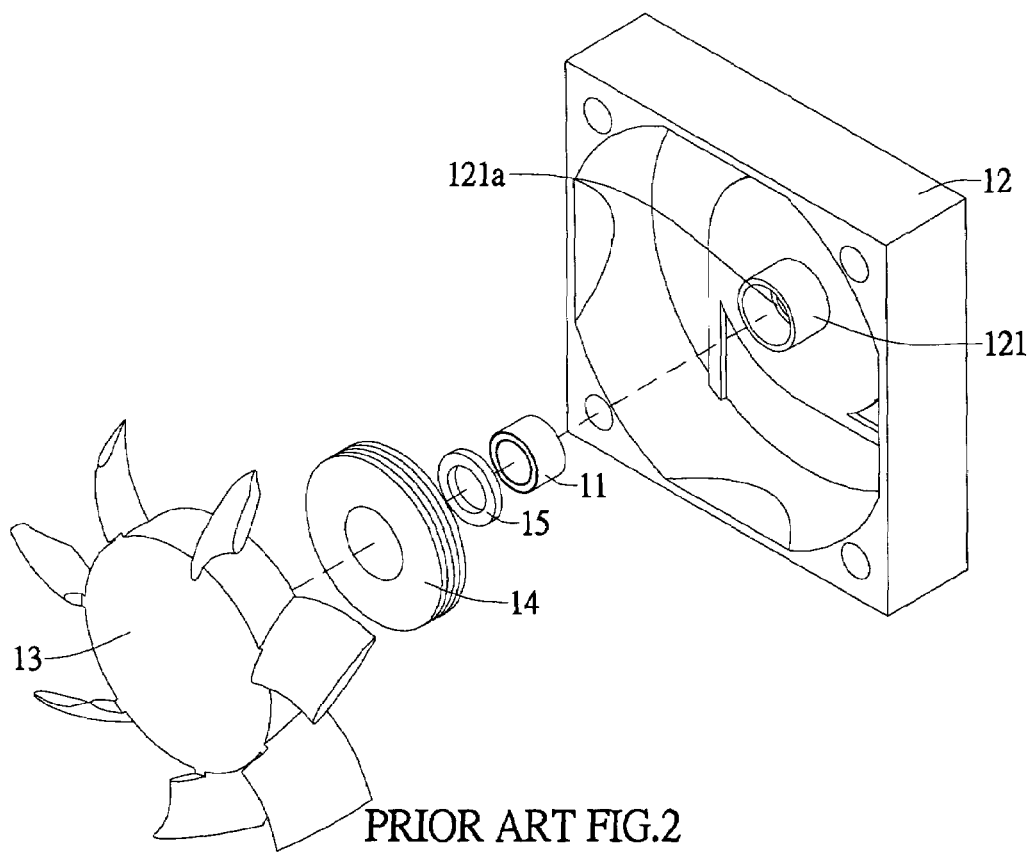
PRIOR ART FIG.2

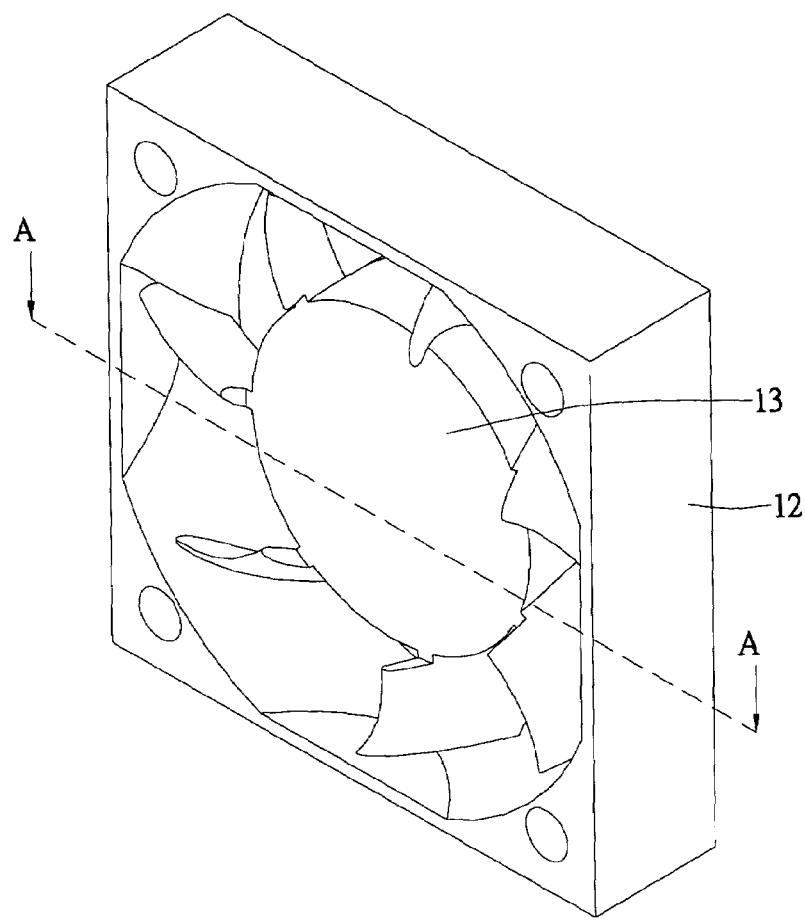
PRIOR ART FIG.3
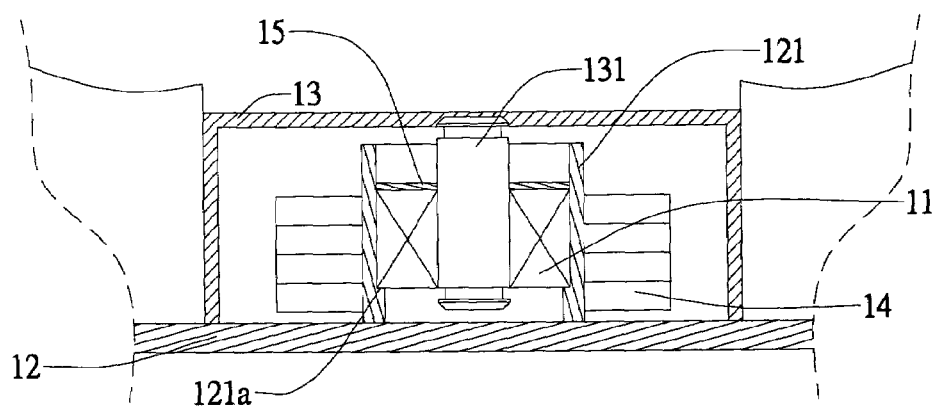
PRIOR ART FIG.4

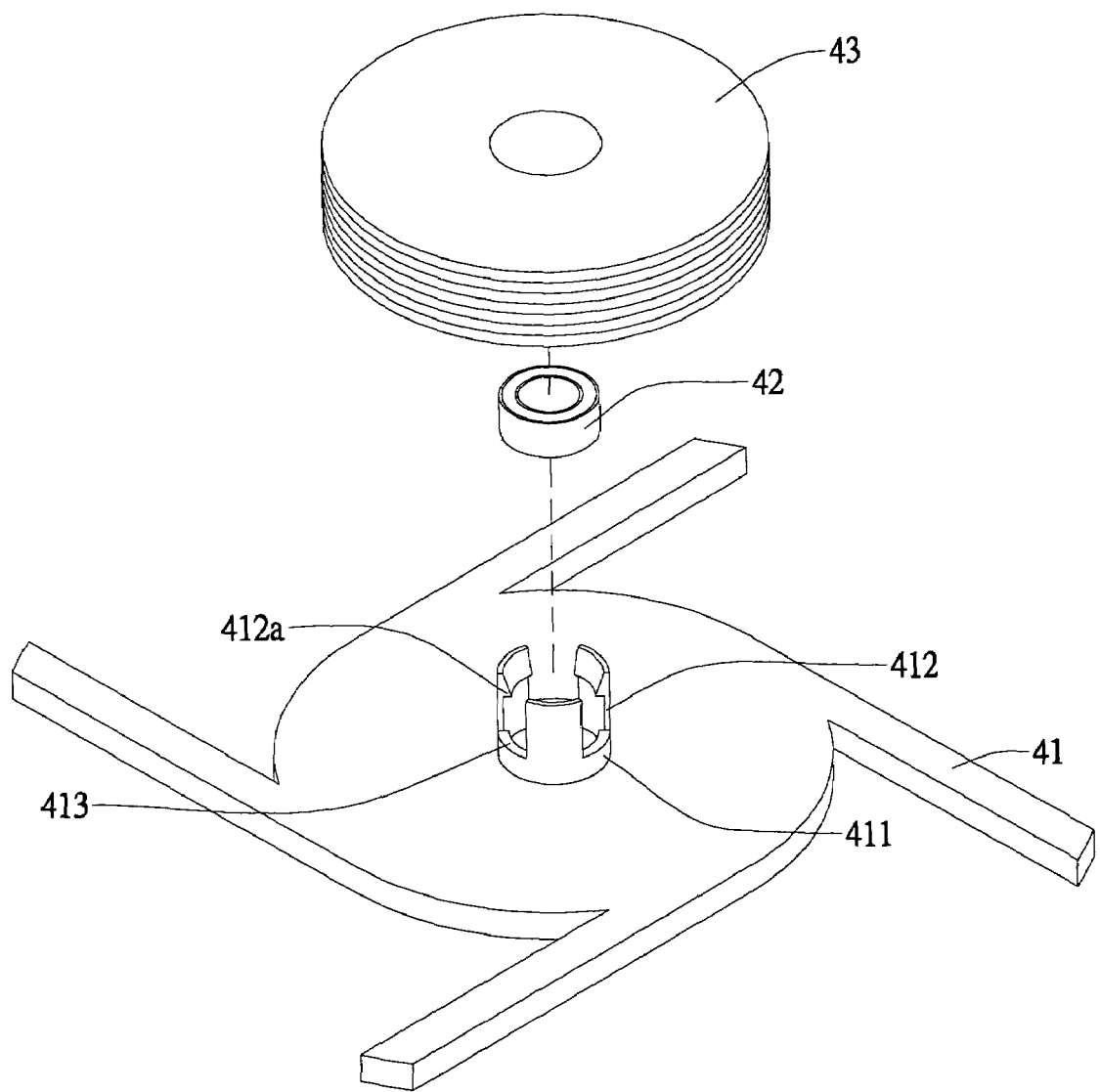
PRIOR ART FIG.5

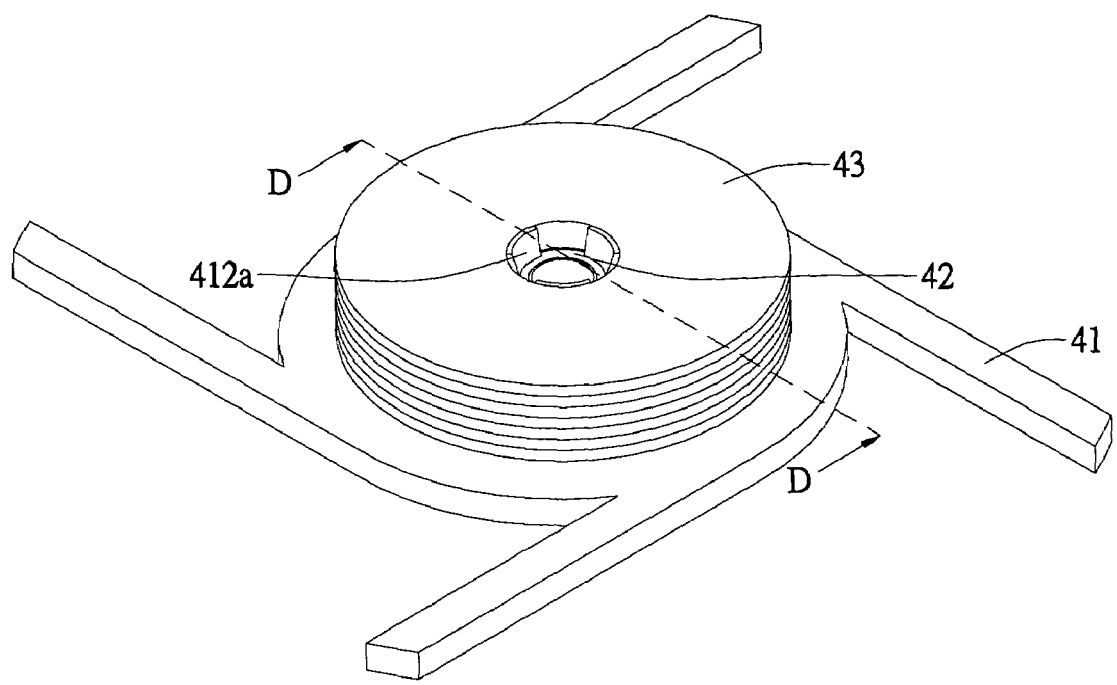
PRIOR ART FIG.6
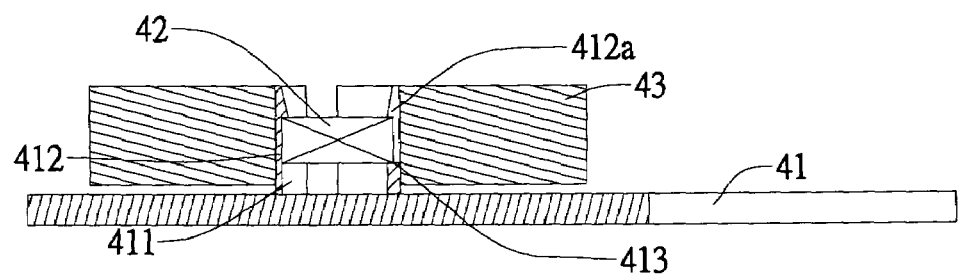
PRIOR ART FIG.7

US 6,969,200 B2

BEARING SUPPORTING STRUCTURE

FIELD OF THE INVENTION

The present invention relates to a bearing supporting structure, and more particularly to a bearing sleeve that is provided on a motor stator unit, and formed near an outer end with radially inward projected stoppers and at an inner end with spaced elastic segments, which are formed at an inner end with radially inward projected flanges having an inclined side surface, so that a bearing may be stably positioned in the bearing sleeve between the stoppers and the flanges, and easily removed therefrom due to the inclined side surfaces of the flanges and the elasticity of the spaced segments.

BACKGROUND OF THE INVENTION

A complete cooling fan mainly includes fan rotor, a bearing, and a motor stator unit. The bearing is mounted in a bearing sleeve provided on the motor stator unit, and the fan rotor has a spindle rotatably mounted in the bearing to enable smooth operation of the fan rotor. In the process of assembling the cooling fan, it is always an important thing to stably mount the spindle of the fan rotor in the bearing. However, it is also very important to stably assemble the bearing to the bearing sleeve on the motor stator unit, so as to ensure smooth rotation of the fan rotor and reduced noise.

FIGS. 1 to 4 illustrates a conventional bearing supporting structure that includes a bearing sleeve 121 provided on a motor stator unit 12 for a bearing 11 to mount therein. The bearing sleeve 121 is provided on an inner surface near an inner end with a stopper 121a. The bearing 11 is tightly fitted in the bearing sleeve 121 between the stopper 121a and a locating ring 15. A coil 14 is externally assembled around the bearing sleeve 121. In the above-described structure, it is difficult to axially locate the bearing 11 when the same is extended into the bearing sleeve 121, and therefore has adverse influence on the stable mounting of a spindle 131 of the fan rotor 13 in the bearing 11. Moreover, the locating ring 15 or other suitable element is needed to tightly fit the bearing 11 in the bearing sleeve 121. The above-mentioned conventional bearing supporting structure therefore has complicate manufacturing process and high manufacturing cost.

FIGS. 5 to 7 illustrates a "bearing sleeve for cooling fan" disclosed in Taiwan Patent Publication No. 310782. The disclosed round bearing sleeve 411 is provided on a motor stator unit 41 and cut into a plurality of spaced segments 412, each of which is provided at an upper inner end with a barb 412a having an inclined surface. Meanwhile, a radially inward projected stopper 413 is formed in each space between two adjacent segments 412 of the bearing sleeve 411. A bearing 42 is positioned into the bearing sleeve 411 via the inclined surfaces of the barbs 412a, so that the bearing 42 is held in the bearing sleeve 411 between the barbs 412a of the segments 412 and the stoppers 413 to avoid separation from the bearing sleeve 411. A coil 43 is externally mounted around the segments 412 to ensure the stable positioning of the bearing 42 in the bearing sleeve 411. When the bearing 42 is damaged, it is necessary to dismount the coil 43 before the damaged bearing 42 may be removed and replaced. Thus, with the conventional bearing sleeve 411, complicate procedures and a lot of time is required to repair, maintain, and replace the bearing 42. And, the replacement of the bearing 42 must be done by a skilled person instead of a general user to avoid damaging the bearing sleeve 411.

It is therefor tried by the inventor to develop an improved bearing supporting structure to eliminate the drawbacks existed in the conventional structures.

SUMMARY OF THE INVENTION

A primary object of the present invention is to provide a bearing supporting structure enabling a bearing to stably position in a bearing sleeve on a motor stator unit.

Another object of the present invention is to provide a bearing supporting structure that enables quick mounting and dismounting of a bearing to and from the bearing supporting structure.

To achieve the above and other objects, the bearing supporting structure of the present invention mainly includes a bearing sleeve provided on a motor stator unit for supporting a bearing therein and a coil therearound. The bearing sleeve is provided on an inner wall surface near an outer end thereof with radially inward projected stoppers, and split at an inner end to provide a plurality of spaced segments having a certain elasticity, each of which is provided at a lower inner surface with a radially inward projected flange having an inclined side surface. The bearing is moved through the flanges into the bearing sleeve to stably position therein between the stoppers and the flanges, so that the bearing may be quickly and easily removed from the bearing sleeve via the elastic segments without the need of moving the coil externally mounted around the bearing sleeve.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein FIG. 1 is a rear exploded perspective view of a conventional bearing supporting structure;

FIG. 2 is a front exploded perspective view of the conventional bearing supporting structure of FIG. 1;

FIG. 3 is an assembled perspective view of the conventional bearing supporting structure of FIG. 1;

FIG. 4 is a sectional view taken along line A—A of FIG. 3;

FIG. 5 is a front exploded perspective view of another conventional bearing supporting structure;

FIG. 6 is an assembled perspective view of the conventional bearing supporting structure of FIG. 5;

FIG. 7 is a sectional view taken along line D—D of FIG. 6;

DETAILED DESCRIPTION OF THE PREFERRED EMBODIMENTS

Figure 8:
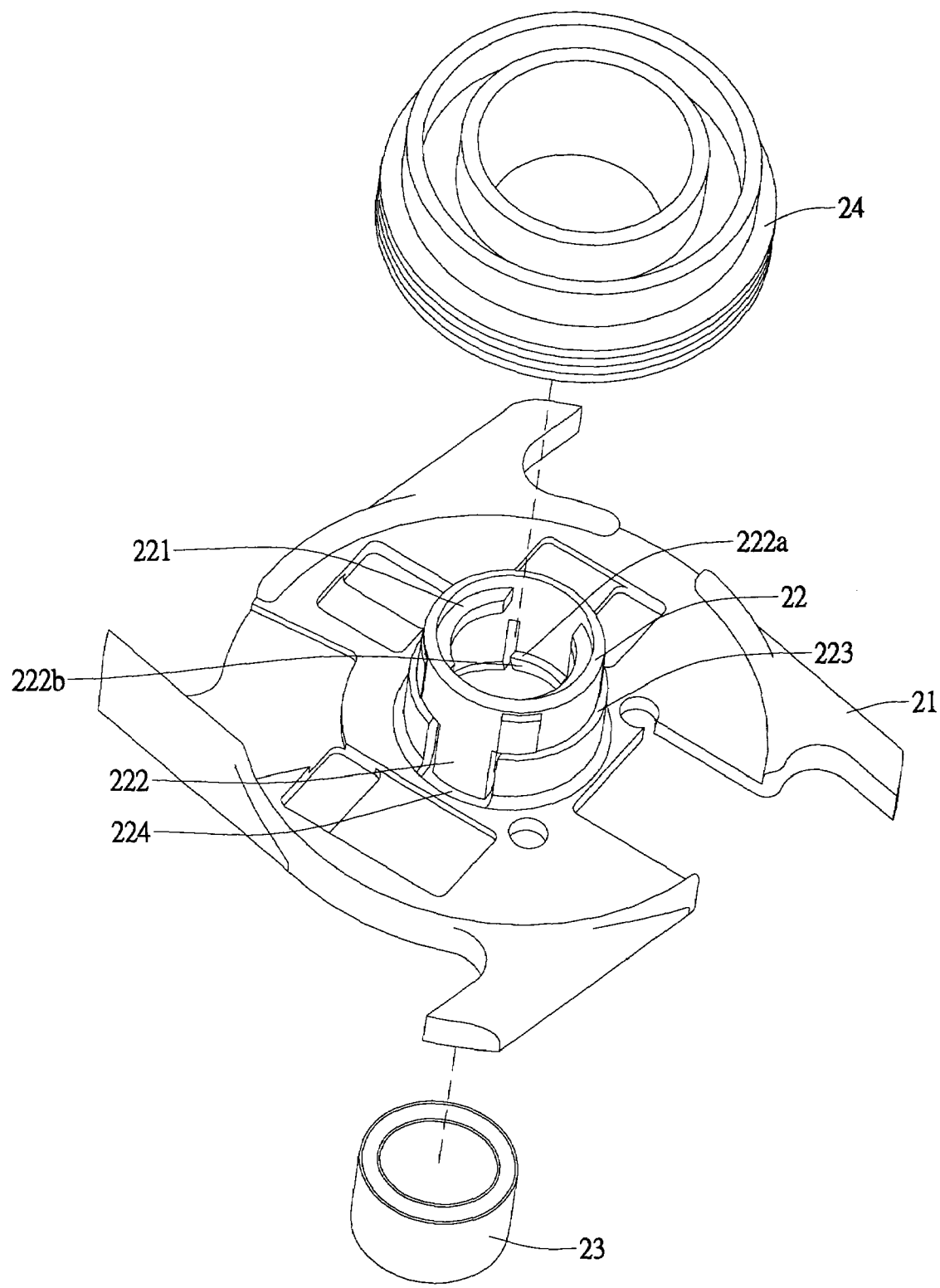
FIG. 8 is a front exploded perspective view of a bearing supporting structure according to a first embodiment of the present invention.
Figure 9:
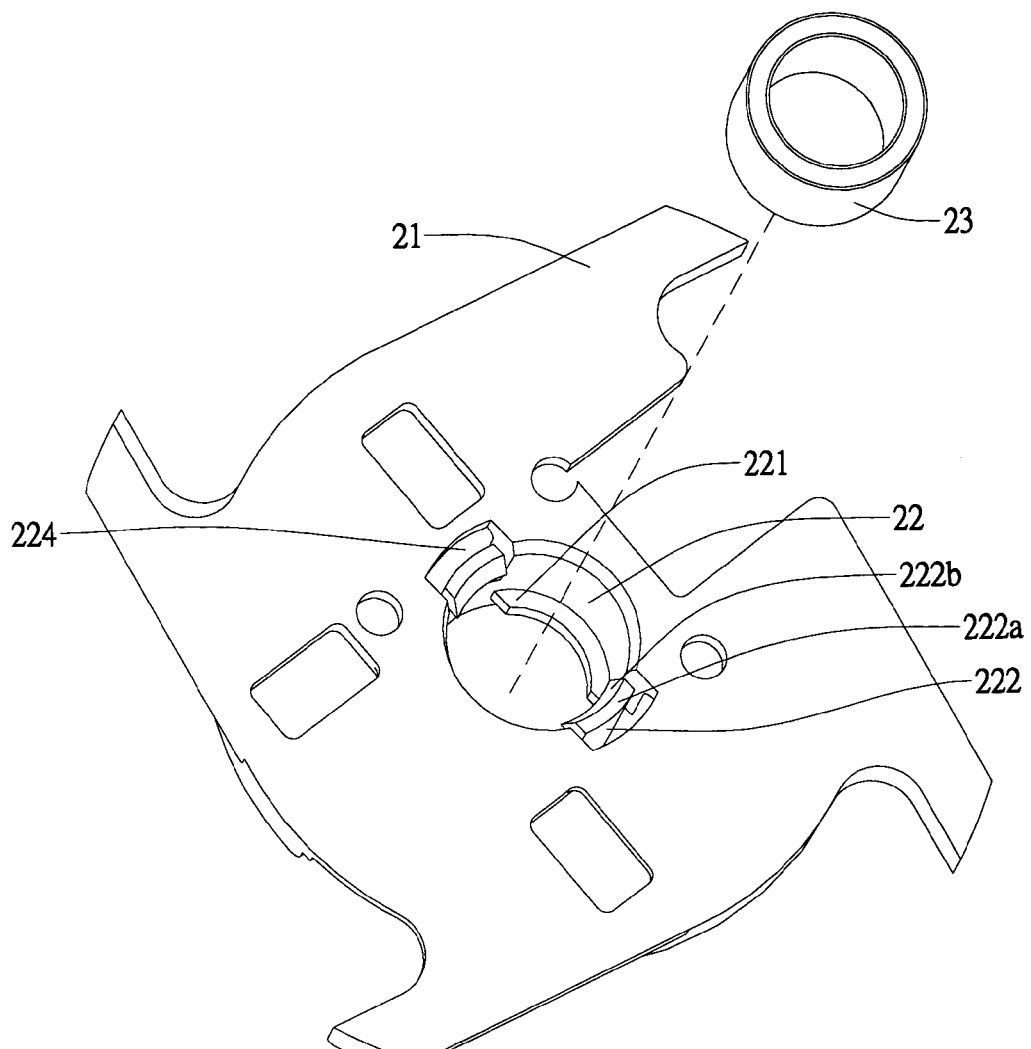
FIG. 9 is a rear exploded perspective view of the bearing supporting structure of FIG. 8.

Please refer to FIGS. 8 and 9 that are front and rear exploded perspective views, respectively, of a bearing supporting structure according to a first embodiment of the present invention. As shown, the bearing supporting structure mainly includes a bearing sleeve 22 provided a motor stator unit 21 for supporting a bearing 23 therein. The bearing sleeve 22 is provided on an inner wall surface near an outer end thereof with radially inward projected stoppers 221. An inner end of the bearing sleeve 22 is split to provide a plurality of segments 222. In the illustrated drawings, two segments 222 are shown. Each of the segments 222 is provided on an inner wall surface near an inner end thereof with a radially inward projected flange 222a, an inner side of which is formed into a downward and radially outward inclined surface 222b, enabling a bearing 23 to easily move through the inclined surfaces 222b into the bearing sleeve 22. The stoppers 221 and the flanges 222a are so located that a vertical space between them corresponds to an overall height of the bearing 23. Areas surrounding a lower outer wall surface of the bearing sleeve 22 other than the segments 222 are formed into supporting wall portions 223, on which a coil 24 is mounted. A flexible space 224 is left between the segments 222 and the supporting wall portions 223.

Figure 13:
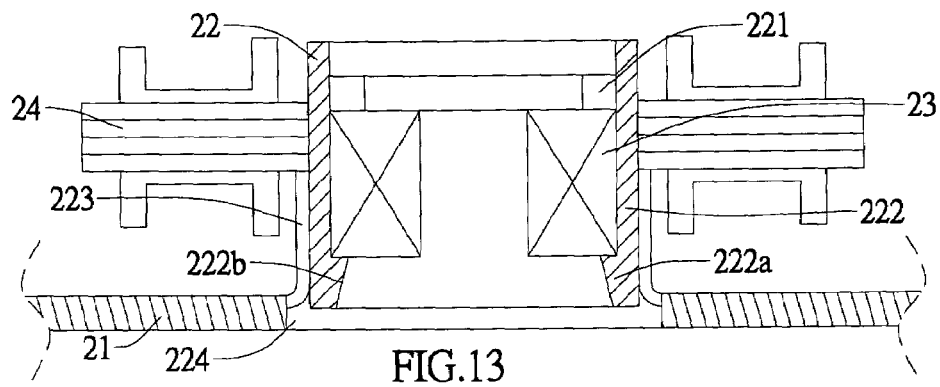
FIG. 13 is a sectional view taken along line B—B of FIG. 11.

Please refer to FIGS. 10 to 13 at the same time. The bearing 23 is mounted in the bearing sleeve 22 via the inclined surfaces 222b of the flanges 222a. Since the segments 222 provide a certain degree of elasticity, they could be radially pushed outward when the bearing 23 is moved through the inclined surfaces 222b of the flanges 222a provided at the inner ends of the segments 222. And, since the stoppers 221 and the flanges 222a together define between them a vertical space equal to the overall height of the bearing 23, the bearing 23 may be stably confined to the bearing sleeve 22 between the stoppers 221 and the flanges 222a. The inclined side surfaces 222b of the flanges 222a facilitates easy moving of the bearing 23 into the bearing sleeve 22 to stably bear against the inner wall surface of the bearing sleeve 22, as shown in FIG. 13. The elasticity of the segments 222 also facilitates quick positioning of the bearing 23 in the bearing sleeve 22. After the bearing 23 has been positioned in the bearing sleeve 22, the coil 24 is assembled to the supporting wall portion 223 at the lower outer surface of the bearing sleeve 22.

Figure 10:
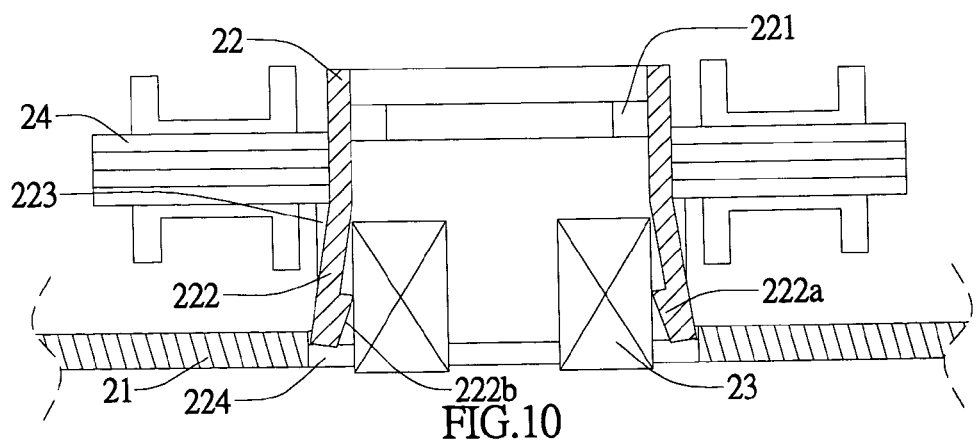
FIG. 10 is a sectional view showing the mounting of a bearing on the bearing supporting structure according to the first embodiment of the present invention.
Figure 11:
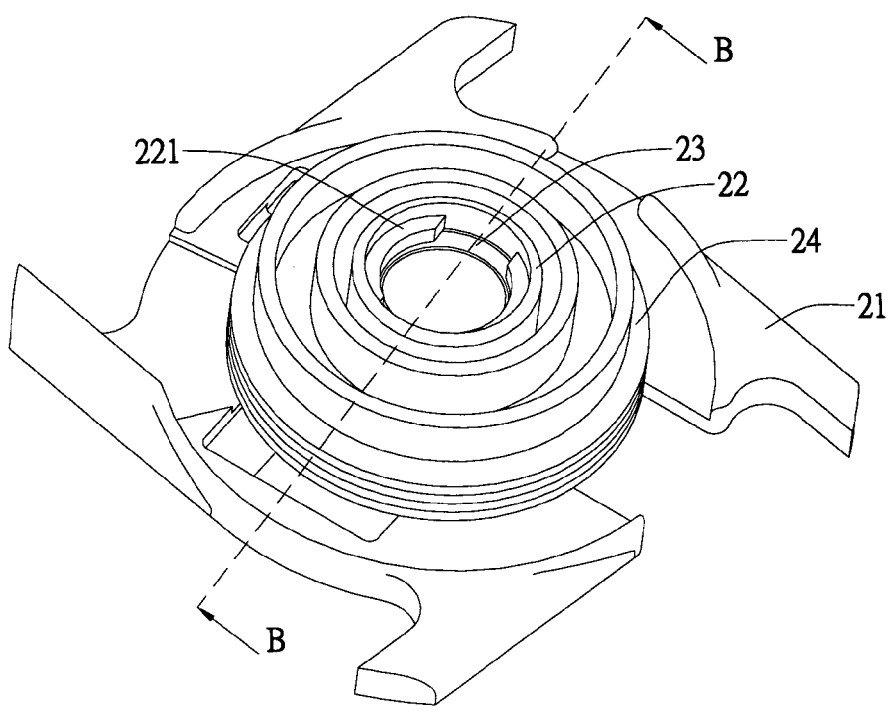
FIG. 11 is a front assembled perspective view of the bearing supporting structure of FIG. 8.
Figure 12:
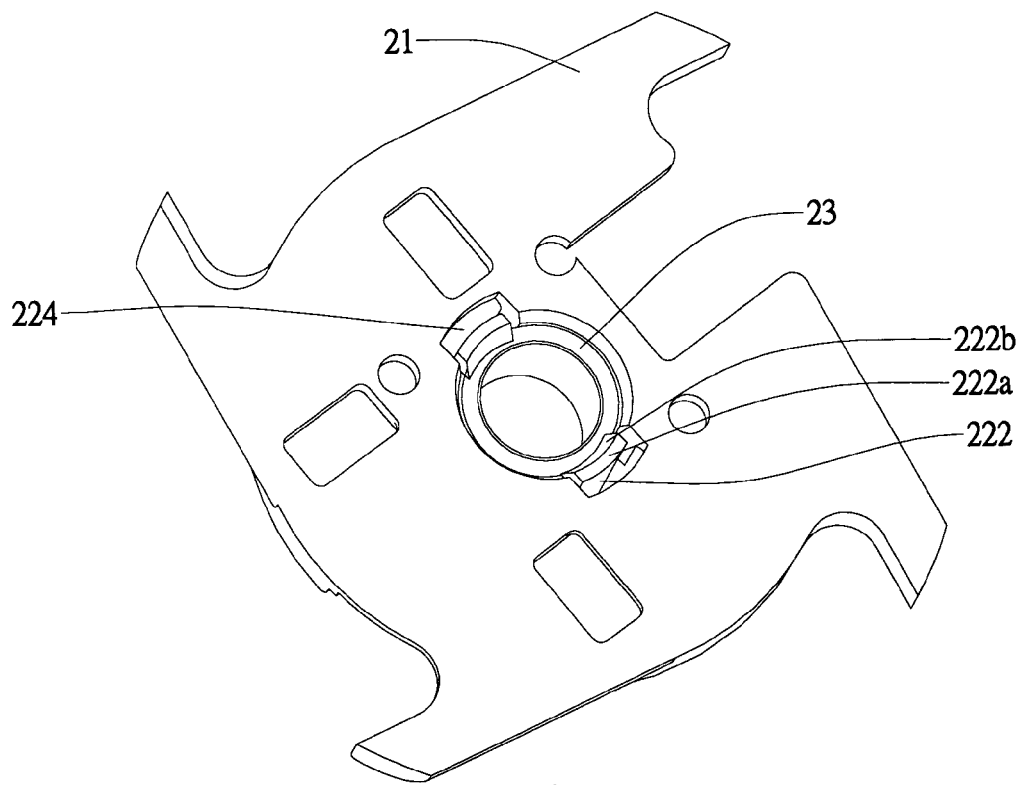
FIG. 12 is a rear assembled perspective view of the bearing supporting structure of FIG. 8.

As can be seen from FIG. 10, the segments 222 could be radially outward pushed within the flexible space 224 existed between the supporting wall portions 223 and the segments 222. When the bearing 23 is damaged and requires replacement thereof, the elasticity of the segments 222 allows the segments 222 to be easily radially outward pushed within the flexible space 224 to facilitate removal of the damaged bearing 23 from the bearing sleeve 22 without the necessity of moving the coil 24 or using any special tools. Therefore, even a general user may easily and quickly complete the replacement of the bearing 23.

Figure 15:
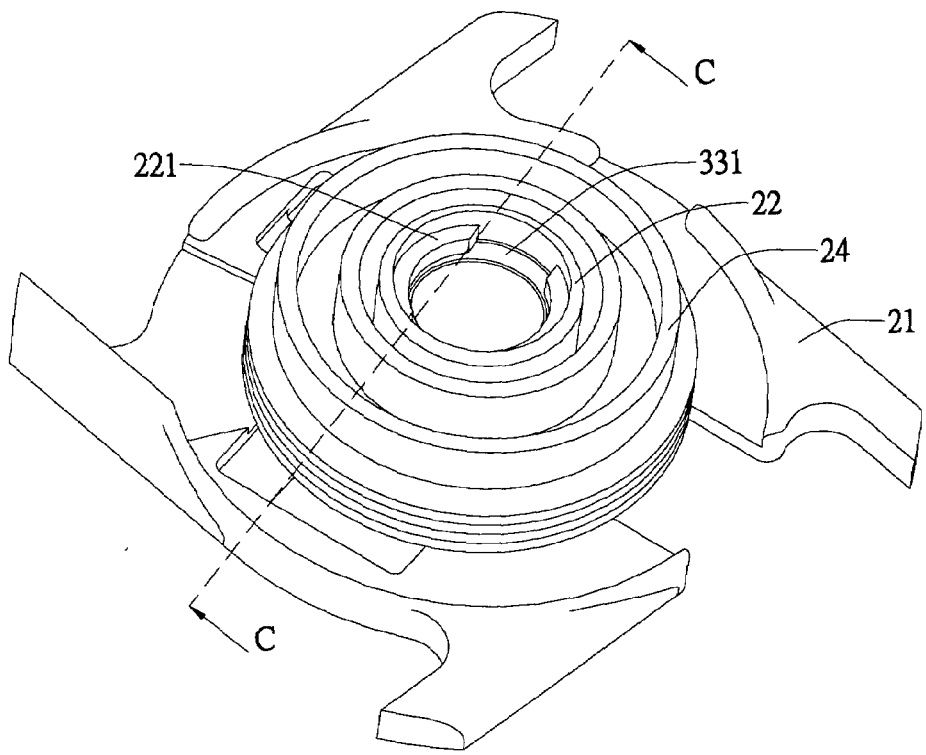
FIG. 15 is an assembled perspective view of FIG. 14.
Figure 16:
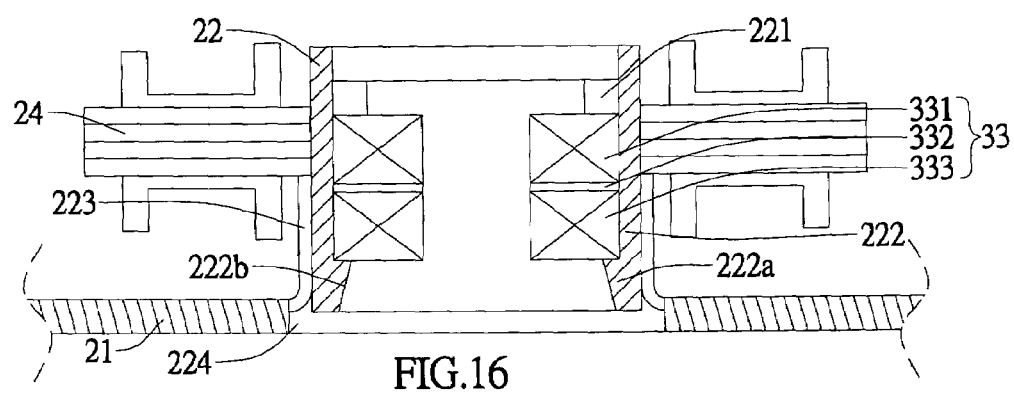
FIG. 16 is a sectional view taken along line C—C of FIG. 15.
Figure 14:
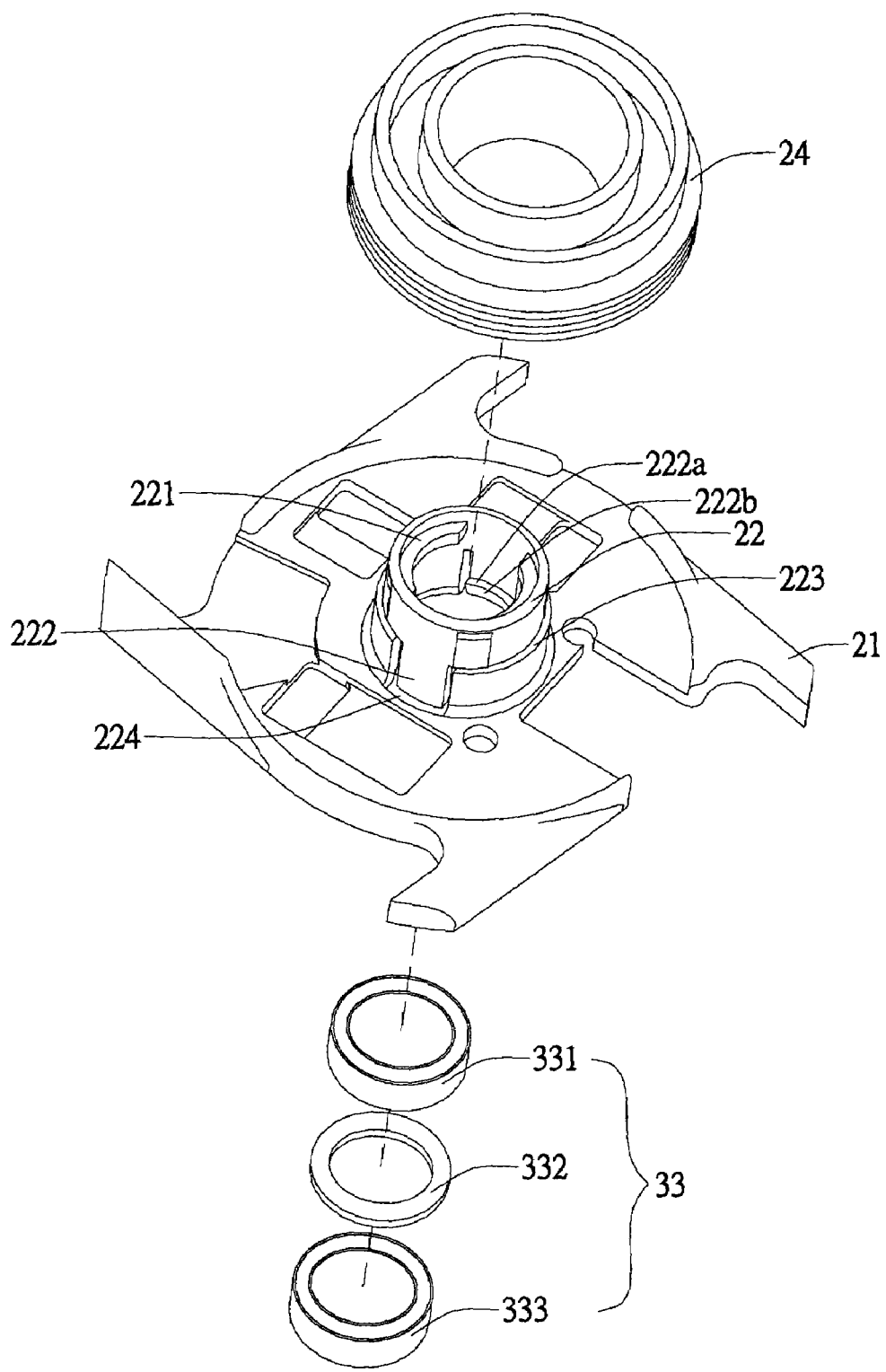
FIG. 14 is an exploded perspective view of a bearing supporting structure according to a second embodiment of the present invention.

FIGS. 14 to 16 illustrates a second embodiment of the present invention. The second embodiment is generally structurally similar to the first embodiment, except that a bearing unit 33 including bearings 331, 333 and bearing spacer 332 is mounted in the bearing sleeve 22. To mount the bearing unit 33 in the bearing sleeve 22, the bearing 331, the bearing spacer 332, and the bearing 333 are sequentially moved into the bearing sleeve 22. Again, the stoppers 221 and the flanges 222a together define between them a vertical space equal to a height of the bearing unit 33, that is, an overall height of the bearing 331, the bearing spacer 332, and the bearing 333, so that the bearing unit 33 may be stably positioned in the bearing sleeve 22 between the stoppers 221 and the flanges 222a.

In the second embodiment, more than one bearing unit 33 may be mounted in the bearing sleeve 22 depending on actual needs in use. However, the bearing and the bearing spacer are always alternately included in each bearing unit, and the vertical space between the stoppers 221 and the flanges 222a is always equal to an overall of the bearing units 33, so that the bearing units 33 may be stably located in the bearing sleeve 22.

Similarly, there is a flexible space 224 existed between the segments 222 and the supporting wall portions 223 in the second embodiment, so that the segments 222 may be easily radially outward pushed to facilitate easy and quick replacement of any damaged bearing unit.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A bearing supporting structure, comprising a bearing sleeve provided on a motor stator unit for supporting a bearing therein and a coil therearound;

said bearing sleeve being provided on an inner wall surface near an outer end thereof with radially inward projected stoppers, and split at an inner end to provide a plurality of spaced segments, each of which being provided at a lower inner surface with a radially inward projected flange; and said bearing being moved through said flanges into said bearing sleeve and stably positioned in said bearing sleeve between said stoppers and said flanges, so that said bearing may be quickly and easily removed from said bearing sleeve via said segments without the need of moving said coil externally mounted around said bearing sleeve.

2. The bearing supporting structure as claimed in claim 1, wherein said stoppers and said flanges together define between them a vertical space corresponding to an overall height of said bearing.

3. A bearing supporting structure, comprising a bearing sleeve provided on a motor stator unit for supporting a bearing unit therein and a coil therearound;

said bearing sleeve being provided on an inner wall surface near an outer end thereof with radially inward projected stoppers; and split at an inner end to provide a plurality of spaced segments, each of which being provided at a lower inner surface with a radially inward projected flange; and said bearing unit including a plurality of bearings spaced by bearing spacers; said bearings and bearing spacers of said bearing unit being alternately moved through said flanges into said bearing sleeve and stably positioned in said bearing sleeve between said stoppers and said flanges, so that said bearing unit may be quickly and easily removed from said bearing sleeve via said segments without the need of moving said coil externally mounted around said bearing sleeve.

4. The bearing supporting structure as claimed in claim 3, wherein said stoppers and said flanges together define between them a vertical space corresponding to an overall height of said bearing unit.

* * * * *